United States Patent [19]

Ilderem et al.

[11] Patent Number: 5,079,182
[45] Date of Patent: Jan. 7, 1992

[54] BICMOS DEVICE HAVING SELF-ALIGNED WELL TAP AND METHOD OF FABRICATION

[75] Inventors: Vida Ilderem, Puyallup; Steven M. Leibiger, Graham, both of Wash.

[73] Assignee: National Semiconductor Corporation, Santa Clara, Calif.

[21] Appl. No.: 503,345

[22] Filed: Apr. 2, 1990

[51] Int. Cl.$^5$ .............................................. H01L 21/76
[52] U.S. Cl. ........................................ 437/57; 437/34; 437/59
[58] Field of Search ............................. 437/34, 56, 57

[56] References Cited

U.S. PATENT DOCUMENTS

| | | |
|---|---|---|
| 3,955,269 | 5/1976 | Magdo et al. |
| 4,374,700 | 2/1983 | Scott et al. ........................ 435/34 |
| 4,484,388 | 11/1984 | Iwasaki . |
| 4,507,847 | 4/1985 | Sullivan . |
| 4,536,945 | 8/1985 | Gray et al. . |
| 4,609,568 | 9/1986 | Koh et al. . |
| 4,677,735 | 7/1987 | Malhi ............................... 437/34 |
| 4,764,480 | 8/1988 | Vora ................................. 437/56 |
| 4,795,722 | 1/1989 | Welch et al. . |
| 4,829,025 | 5/1989 | Iranmanesh . |
| 4,897,364 | 1/1990 | Nguyen . |

OTHER PUBLICATIONS

Brassington et al., "An Advanced Single-Level Polysilicon Submicrometer BiCMOS Technology," *IEEE Trans. Elect. Devices*.

Momose et al., "1 μm n-well CMOS/Bipolar Technology," *IEDM Transactions* (Feb. 1985), p. 217.

Kapoor et al., "A High Speed High Density Single-Poly ECL Technology for Linear/Digital Applications" 1985 Custom Integrated Circuits Conference.

Gomi et al., "A Sub-30psec Si Bipolar LSI Technology" *IEDM Technical Digest* (1988), pp. 744-747.

Takemura et al., "BSA Technology for Sub-100mn Deep Base Bipolar Transistors" *IEDM Technical Digest* (1987), pp. 375-377.

Chiu et al., "A Bird's Beak Free Local Oxidation Technology Feasible to VSLI Circuits Fabrication" *IEEE Transactions on Electron Devices*, vol. ED-29, No. 4, pp. 536-540, Apr. 1982.

Primary Examiner—Olik Chaudhuri
Assistant Examiner—Long Pham
Attorney, Agent, or Firm—Michael A. Glenn; Robert C. Colwell; Richard L. Hughes

[57] ABSTRACT

A well tap for a field effect device formed using a single polysilicon process and a silicide layer is provided. The polysilicon layer which makes contact to the well is doped the same way as the well but is doped opposite of the source or drain. The silicide layer is formed on the upper and sidewall surfaces of the source or drain, well tap, and gate contacts for a field effect device. The silicide layer extends from the sidewall silicide across the upper surface of the transistors and up to the sidewall oxide of the transistor gates. The structure makes it possible to eliminate laterally-spaced separate well taps used in previous devices. Elimination of the laterally-spaced well taps permits hgher packing density, and lowers buried layer-to-substrate capacitance.

10 Claims, 10 Drawing Sheets

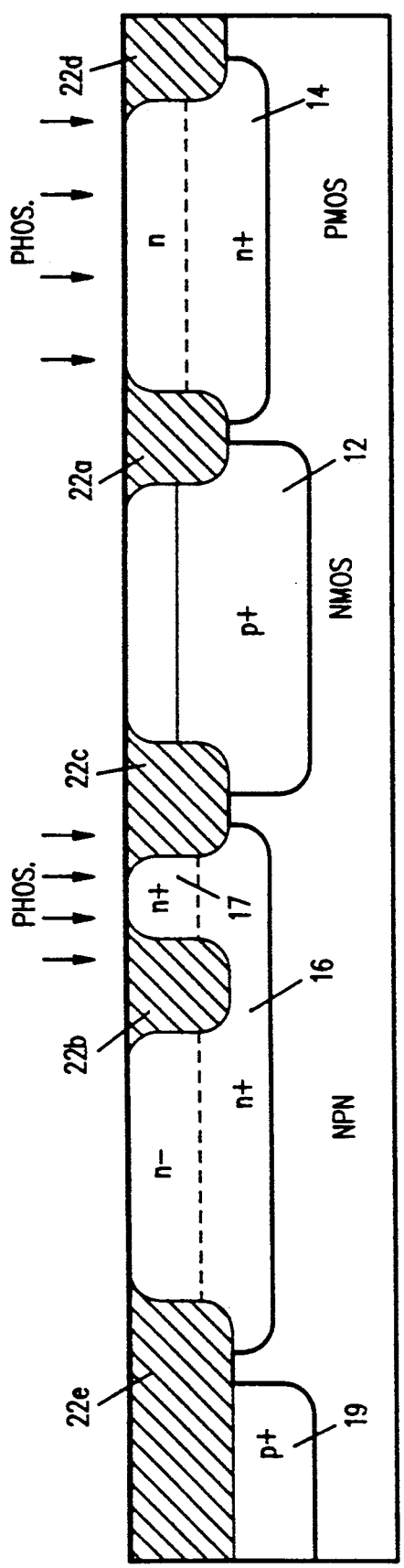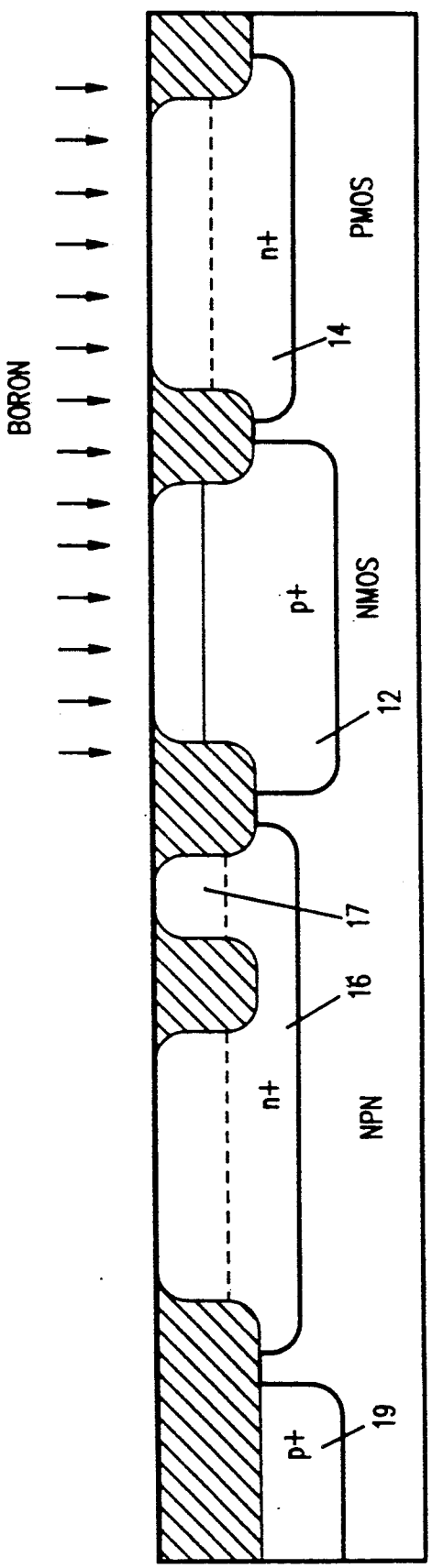

BICMOS DEVICE HAVING SELF-ALIGNED WELL TAP AND METHOD OF FABRICATION

BACKGROUND OF THE INVENTION

The present invention relates to the field of semiconductor devices and their manufacture. More specifically, in one embodiment the invention provides both bipolar and complementary metal-oxide (CMOS) semiconductor devices on a single substrate and a process for their fabrication.

Bipolar and CMOS devices and their fabrication have been well known for many years. Recently, the advantages of both types of devices have been beneficially incorporated into circuits using both types of devices on a single substrate. Circuits which incorporate both bipolar and CMOS devices have come to be known as "BiCMOS." BiCMOS devices offer the advantages of the high packing density and low power consumption of CMOS devices, as well as the high speed of bipolar devices. One BiCMOS device and process for fabrication thereof is described in U.S. Pat. No. 4,764,480 (Vora),. assigned to the assignee of the present invention.

While meeting with some success, BiCMOS technology continues to have certain limitations. For example, well taps laterally spaced from the source and drain regions sometimes occupies surface area of the device. Because of the amount of space occupied by such well taps, the number of devices and circuitry which can be placed on a substrate is less than desired.

From the above it is seen that an improved BiCMOS structure and method of fabrication thereof is desired not only to provide devices with improved performance and reduced size, but also to provide a structure with increased area for placement of devices and circuitry.

SUMMARY OF THE INVENTION

An improved BiCMOS device and method of fabrication thereof is disclosed. The invention provides devices which have improved performance, reduced size, and/or which may be fabricated more simply and economically. A self-aligned well tap formed using single polysilicon and silicide technologies eliminates the need for a well tap region laterally spaced from the source and drain regions. Previous laterally-spaced separated well taps occupied, for example, an excess width of about as much as 3.2 microns, and the present invention, therefore, provides a savings of 3.2 microns per well tap in device packing density. The BiCMOS process may provide, for example, 0.8 $\mu$m gate length CMOS devices for use in the context of a 14 GHz BiCMOS process. The devices disclosed herein may be used with, for example, high performance Emitter Coupled Logic (ECL) standard cell designs, memory cells, gate array designs with embedded memory, and the like.

In one embodiment, the invention involves forming an active region in a substrate, followed by epitaxial silicon growth, oxide isolation, and polysilicon deposition. The polysilicon is implanted and patterned to form MOS and bipolar devices, well taps, substrate taps, and a local interconnect. Oxide spacers are formed, and selectively removed from source-drain and base contacts, after which a refractory metal coating is deposited on the tops and sidewalls of all structures. The metal is reacted with the underlying polysilicon and epitaxial silicon forming a low resistance silicide layer everywhere but on the isolation field oxide and the spacers. The silicide layer thus electrically connects the bipolar base and the CMOS source-drain polysilicon contacts to the epitaxial silicon. Shorting of the gate and emitter polysilicon to the epitaxial silicon is prevented by the spacer oxide. Since the polysilicon source-drain contacts are connected to the epitaxial source-drain regions by the silicide, it is not necessary for the polysilicon contact and source-drain region to have identical doping. Furthermore, by intentionally doping the polysilicon contact opposite from the epitaxial source-drain region,, electrical connection to both the source-drain epitaxial region and the epitaxial tub (well) region can be achieved in a single, integrated structure, thus eliminating the need for a separate, laterally isolated, well tap region.

A further understanding of the nature and advantages of the inventions herein may be realized by reference to the remaining portions of the specification and the attached drawings.

DESCRIPTION OF THE PREFERRED EMBODIMENTS

Contents

I. General
II. Fabrication Sequence of a BiCMOS Device
III. Device Performance

I. General

Figure 1:
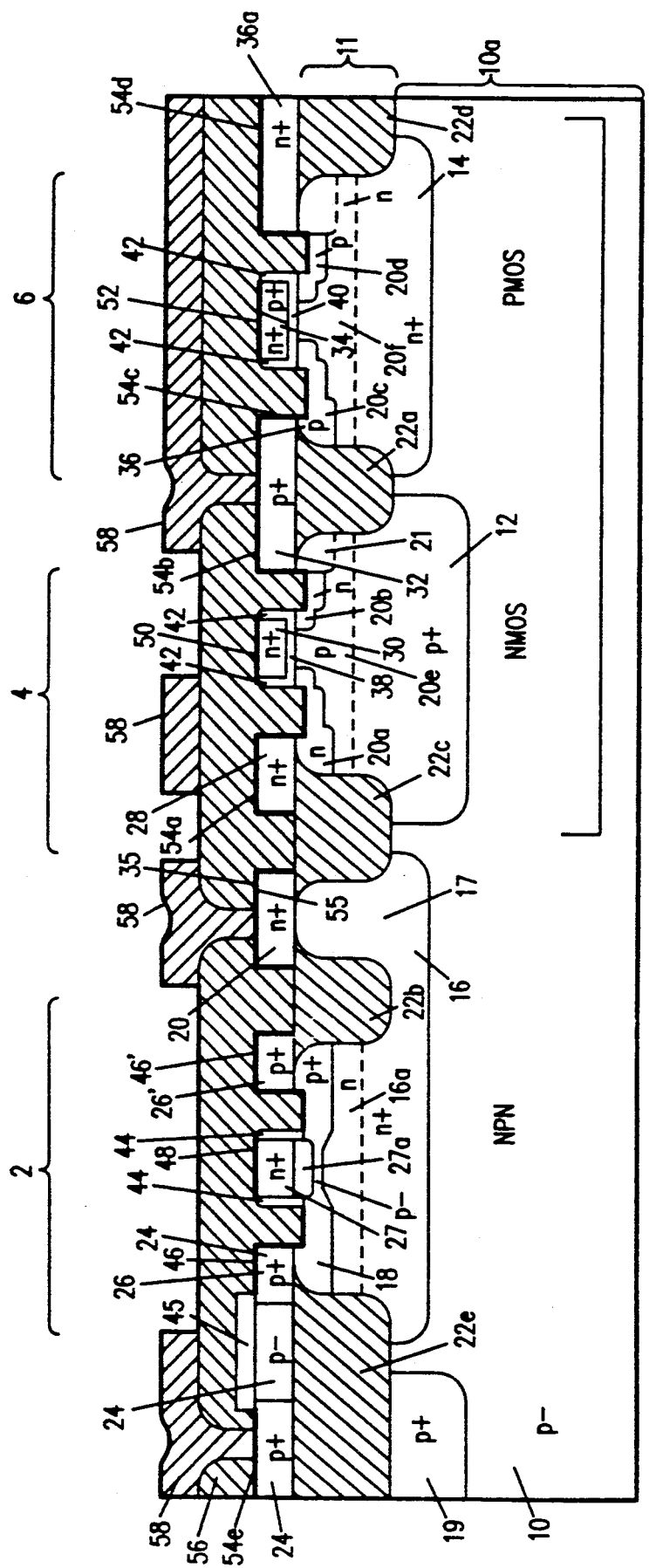
FIG. 1 is a cross-section of a BiCMOS structure according to one embodiment of the invention; and FIG.'S 2a to 2n illustrate fabrication of a BiCMOS device.

FIG. 1 illustrates a BiCMOS device in cross-section according to one embodiment of the invention. The device includes a bipolar transistor 2 (which in the embodiment shown in FIG. 1 is an NPN transistor), an n-channel MOSFET (NMOS transistor) 4-and a p-channel MOSFET (PMOS transistor) 6. The NMOS transistor 4 and the PMOS transistor 6 are appropriately connected to form a CMOS structure 8. The devices are fabricated on a substrate 10 which preferably includes a single-crystal body 10a and an epitaxial layer 11. In the embodiment shown in FIG. 1 the substrate is a p- substrate having a dopant concentration of between about $1 \times 10^{13}$ and $1 \times 10^{15}$ atoms per cubic centimeter.

In most embodiments the NMOS transistor 4 is formed in a p+ tub or well 12 and the PMOS transistor 6 is formed in an n+ tub or well 14. In preferred embodiments the n-well 14 is doped to a concentration of between about $1 \times 10^{16}$ and $1 \times 10^{17}$, and the p+ well 12 is doped to a concentration of between about $5 \times 10^{16}$ and $1 \times 10^{18}$, although a wide range of dopant concentrations may be used without departing from the scope of the invention. Wells 12 and 14 enable the complementary conductivity devices to be formed on a single substrate.

The NPN transistor 2 is provided with a heavily doped buried layer 16 and collector sink 17, which together provide a low resistance connection region between a collector contact 20 and the collector 16a beneath p-type base 18. In preferred embodiments the buried layer 16 and sink 17 are doped to a concentration of between about $1 \times 10^{18}$ and $1 \times 10^{20}$. The collector 16a is a more lightly doped n-type formed between the base region 18 and the buried layer 16. An emitter region 27a is diffused from the emitter contact 27 into the underlying epitaxial layer 11. It is to be understood that those of skill in the art sometimes refer to the emitter contact 27 as the emitter. No difference in meaning is intended herein.

The NMOS and PMOS devices 4, 6 include regions formed in the epitaxial layer 11 of the substrate 10. N-doped regions 20a, 20b form the source and drain regions of the NMOS device separated by a channel region 20e. P-doped regions 20d, 20c form the source and drain regions of the PMOS device separated by a channel region 20f. The epitaxial region 21 adjacent the NMOS drain 20b is a p-type region and thus forms a pathway between the well tap 32 and the NMOS well 12.

P+ channel stop 19 is provided between the NPN transistor and adjacent devices to prevent surface inversion of the lightly doped substrate which would short circuit the buried layer 16 with adjacent devices. Between the NMOS transistor 4 and the PMOS transistor 6, between the sink 17 and the base 18, between the NPN and NMOS transistor, and between the transistors shown in FIG. 1 and adjacent transistors, oxide isolation regions 22a, 22b, 22c, 22d, and 22e respectively, are provided for device isolation. Viewed from the top of the structure, these oxide isolation regions connect to each other to form annular bands around the active device areas.

Along the surface of the device are polycrystalline silicon (polysilicon) regions forming a resistor 24, p+ base contact 26 (which also functions as an end contact for the resistor 24) and 26', emitter contact 27, n+ collector contact 20, NMOS source contact 28, NMOS gate 30, well tap/NMOS drain contact 32, PMOS drain contact 36, continuous with the well tap 32, PMOS gate 34, and PMOS source contact 36a.

Figure 1A:
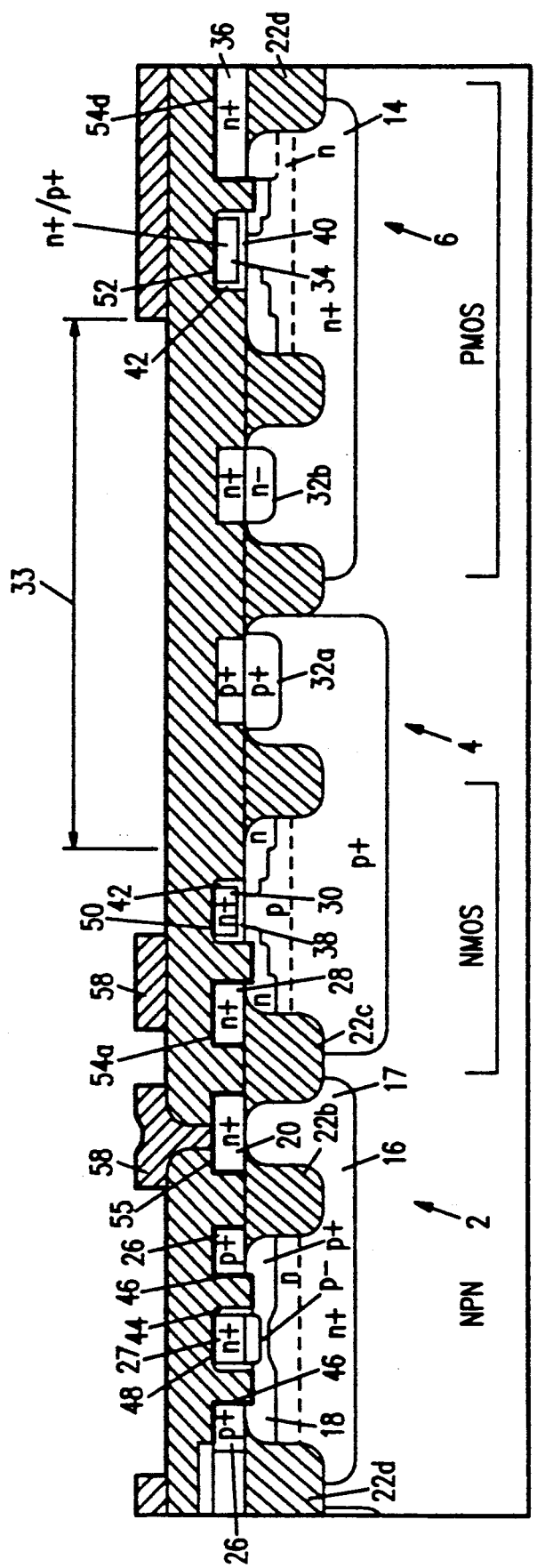

In contrast, FIG. 1A depicts how the embodiment shown in FIG. 1 would appear if separate laterally spaced well taps 32a, 32b were provided. As can be seen, when separate laterally spaced well taps are provided, additional device width 33 is required.

As seen in FIG. 1, thin gate oxide layers 38, 40 are provided beneath the NMOS and PMOS transistor gates, and sidewall oxide 42 is provided on the sides of the NMOS and PMOS gates. In preferred embodiments the NMOS gate 30 is formed of heavily doped n+ polysilicon, while the PMOS gate 34 is formed from n+ or p+ polysilicon, with n+ preferred because n+ will provide a buried channel device while p+ will provide a surface channel device. Sidewall oxide 44 is also provided on the sidewalls of the bipolar emitter 27. A layer of oxide 45 is positioned centrally over the resistor 24 to prevent formation of silicide which would otherwise increase resistor conductivity.

Refractory metal silicide contacts 46, 46' are formed on the p+ bipolar transistor base contacts 26, 26'. The silicide contact covers the upper portions of the base contacts, the sidewalls of the base contacts, as well as the base region from the sidewalls of the base contacts up to the sidewall oxide of the emitter contact 27. A separate silicide contact 48 is provided along the top portion of the emitter 27 between the sidewall spacer oxide regions 44. The refractory metal contacts shown herein reduce the resistivity of the base contact and, therefore, increase the speed of the device.

Similarly, silicide contacts are provided for collector contact 20, NMOS source 28, NMOS gate 38, p+ well tap 32, PMOS gate 34, and p+ source contact 36a. Like the contact for the emitter 27, the silicide contacts 50 and 52 for the NMOS and PMOS gates, respectively, extend only from sidewall oxide to sidewall oxide. Conversely, the silicide contacts 54a, 54b, 54c, and 54d for the NMOS and PMOS source, drain, and well tap contacts 28, 32, 36a cover the upper surfaces and sidewalls of the polysilicon contacts and extend along the horizontal portion of the source/drain, in contact with the epitaxial silicon layer, up to the sidewall oxide of the gates 30 and 34. The silicide contact 35 for the collector contact 20 covers the sidewalls of the contact down to field oxide regions 22b and 22c, as well as the upper surface of the collector contact 20. Silicide 54e covers a part of the upper surface of the far end contact of the resistor 24. The structure further includes a thick (0.7 to 1.5 micron) oxide layer 56 to insulate the devices from metal layer 58, used for interconnection purposes.

II. Fabrication Sequence of a BiCMOS Device

Figure 2C:
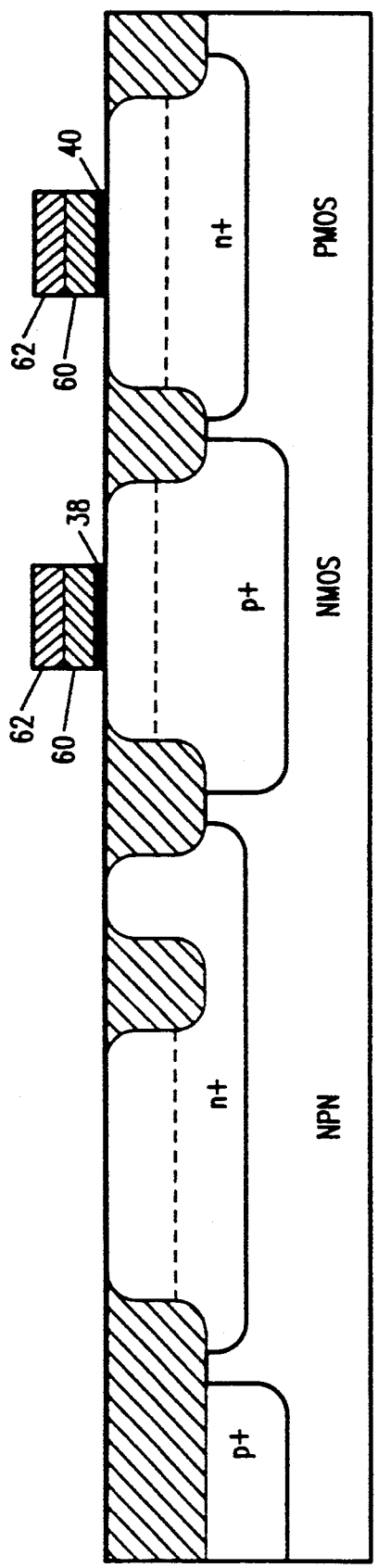
Figure 2D:
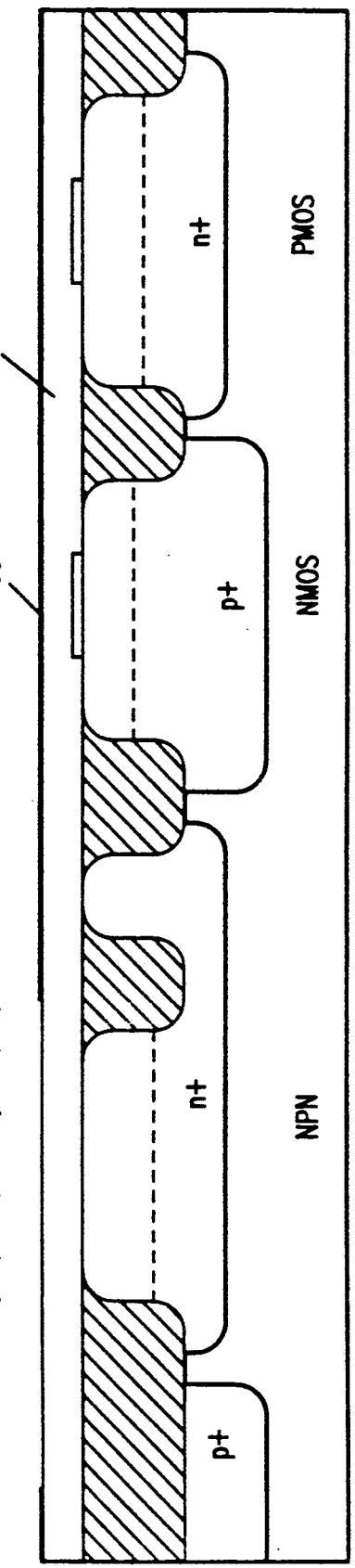
Figure 2E:
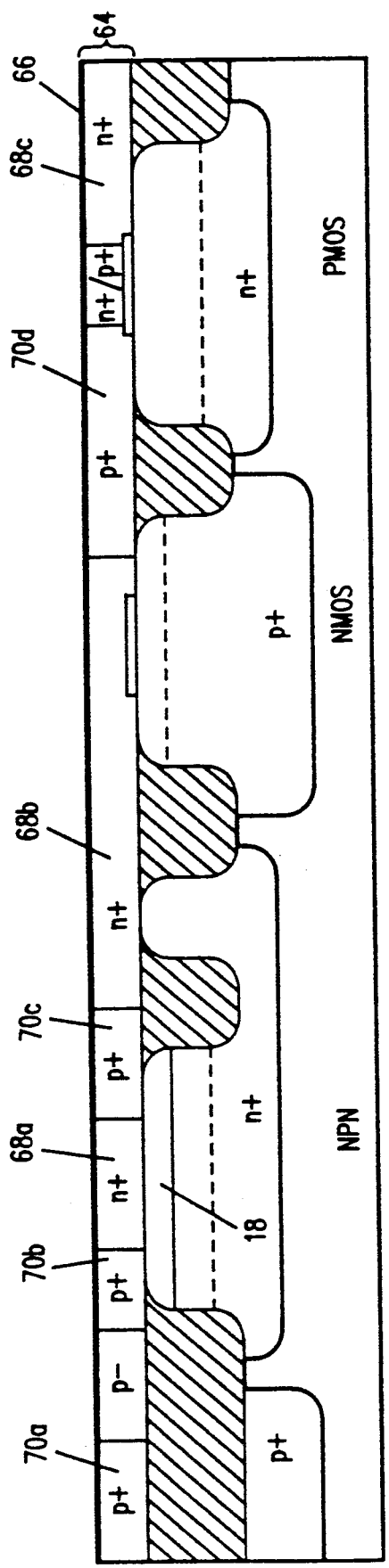
Figure 2F:
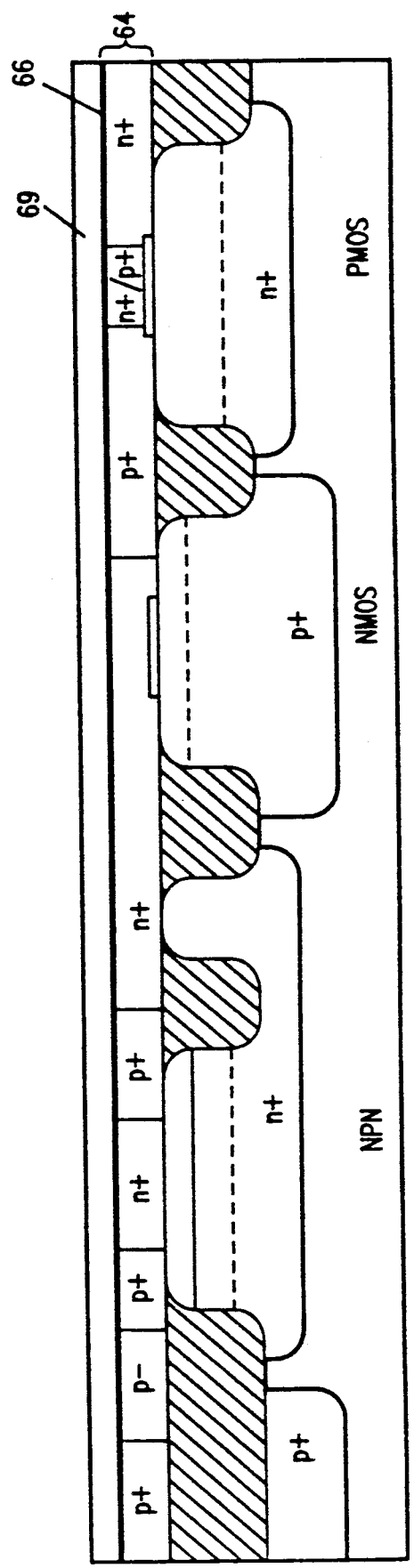
Figure 2G:
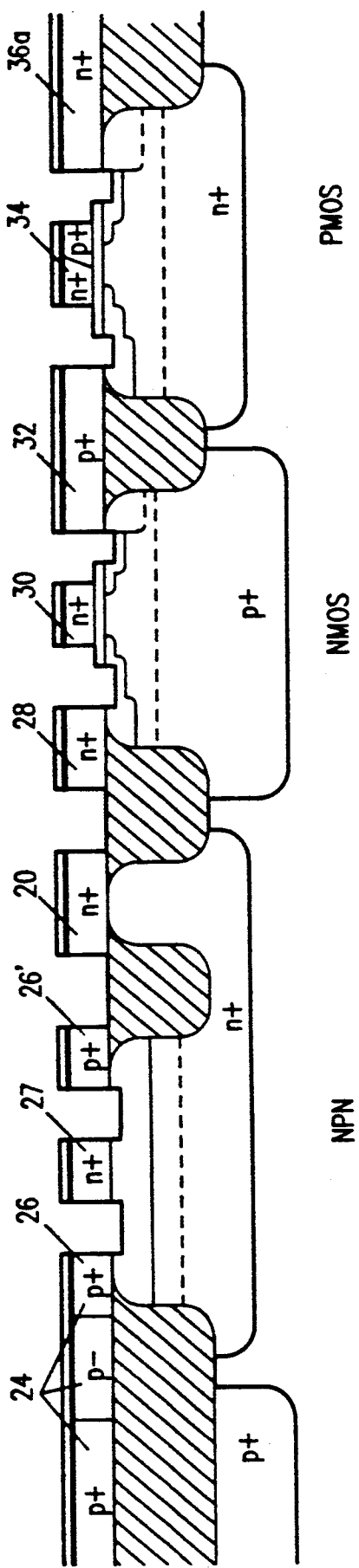
Figure 2H:
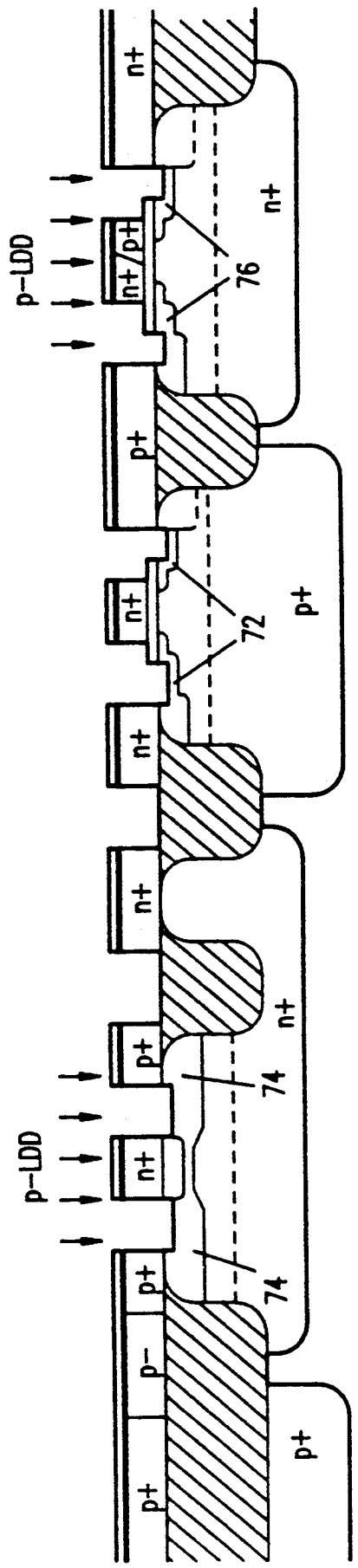
Figure 2I:
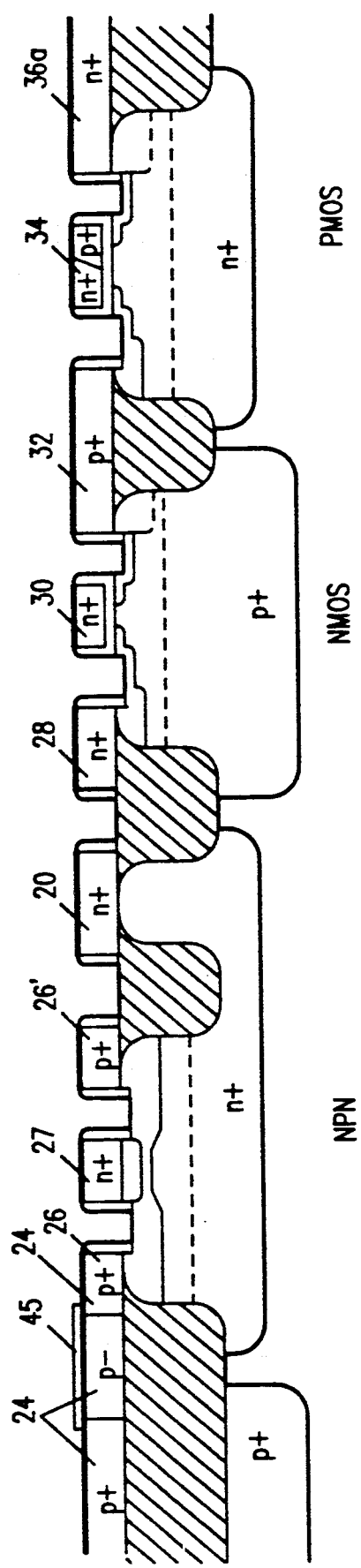
Figure 2J:
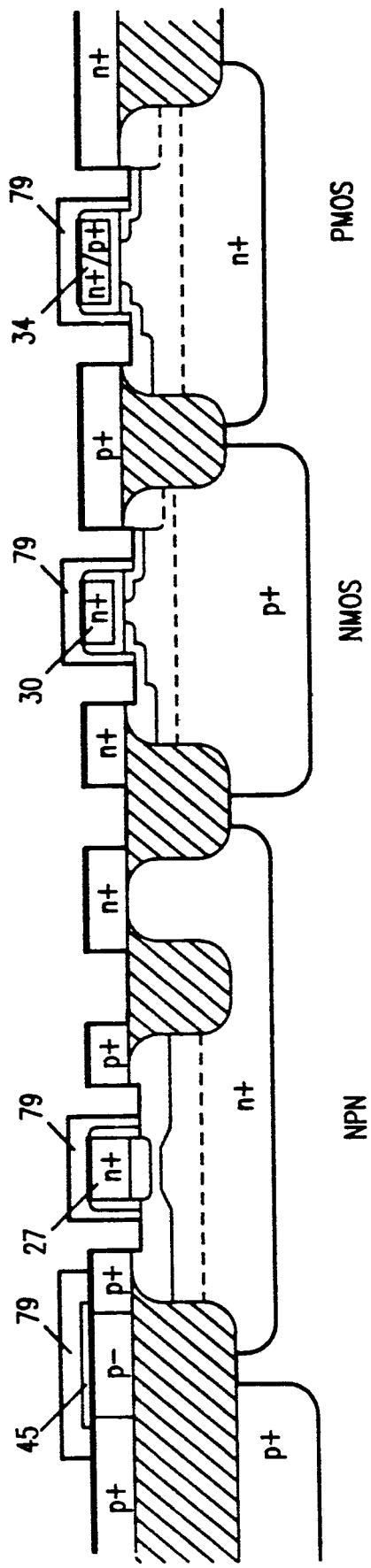
Figure 2K:
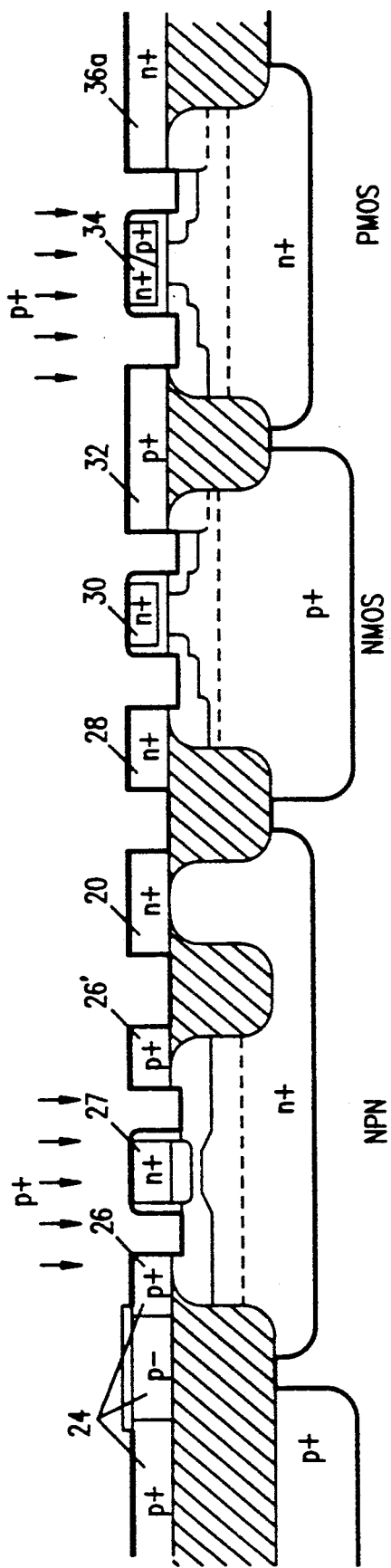
Figure 2L:
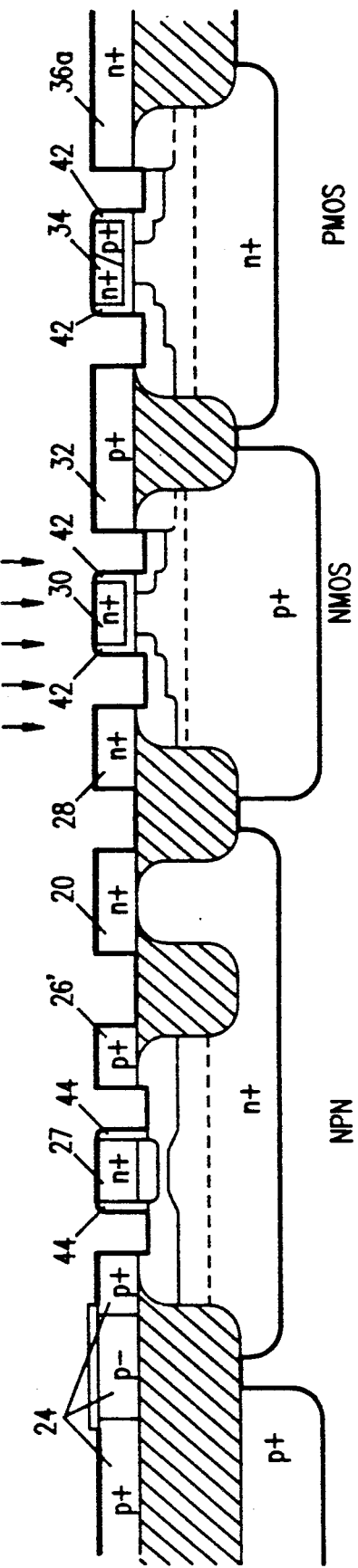
Figure 2M:
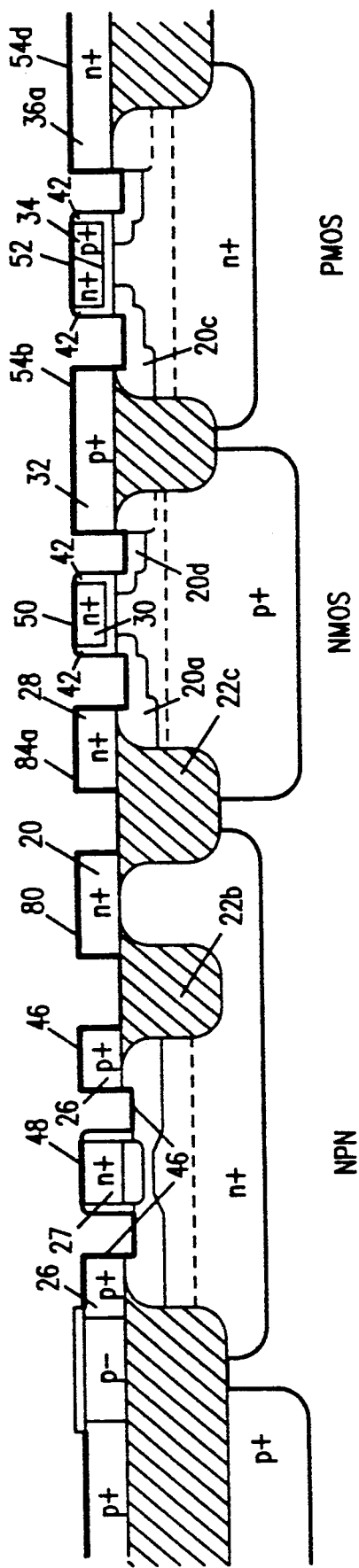
Figure 2N:
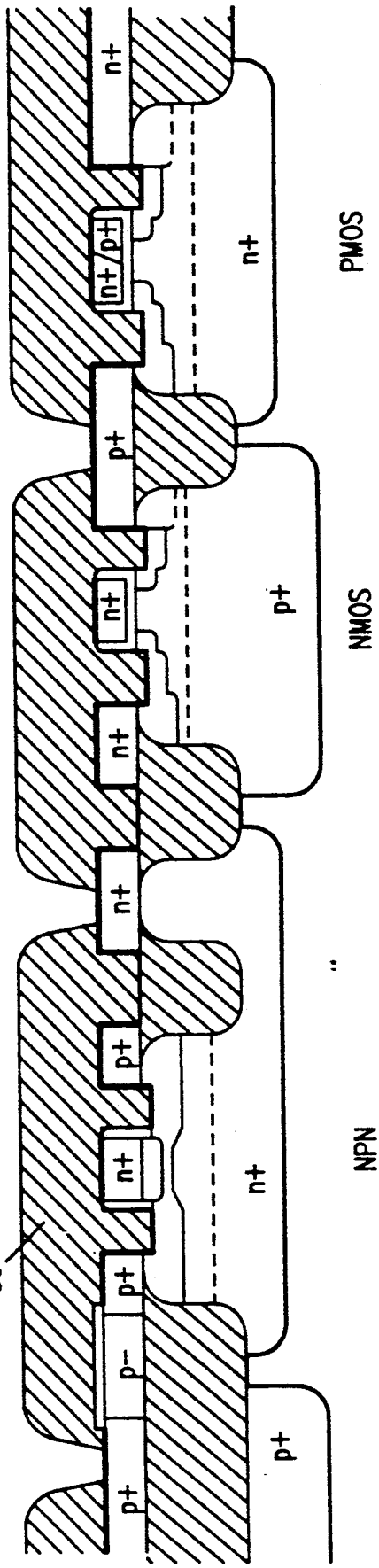

FIGS. 2a through 2n illustrate fabrication of the BiCMOS devices shown in FIG. 1. In particular, FIG. 2a illustrates a cross-section of the devices at a first stage of their fabrication. To reach this stage, the single-crystal body 10a was masked for simultaneous formation of the n+ well 14 and the NPN buried layer 16 with arsenic, antimony, or the like. The implant energy used for formation of regions 14 and 16 is preferably between about 50 and 100 keV such that the dopant concentration of regions 14 and 16 is between about $1 \times 10^{18}$ and $1 \times 10^{20}$.

After formation of the n+ regions 14 and 16, the device is then masked for simultaneous formation of the p+ channel stop 19 and the NMOS well 12. The implant energy used in formation of the regions 19 and 12 is preferably between about 100 and 180 keV such that the dopant concentration of the p+ buried layers is between about $1 \times 10^{17}$ and $1 \times 10^{18}$. The p+ regions preferably are doped with boron.

The buried layer/channel stop mask is then removed and an intrinsic n-type epitaxial layer 11 having a thickness of about 1 to 1.2, preferably about 1.1 microns is grown across the surface of the single-crystal body 10a. A photoresist mask is then formed over the device so as to define oxide regions 22a, 22b, 22c, 22d, and 22e. The oxide, regions are formed using a modified sidewall masked isolation ("SWAMI") process. The SWAMI process is described in, e.g., Chin, et al., IEEE Transactions on Electron Devices, Vol. ED-29, No. 4, April 1982, pp. 536–540. In some embodiments, the process is modified as described in co-pending application serial number 502,943 incorporated by reference.

Thereafter, a grown screen oxide layer having a thickness of about 250Å is formed on the surface of the device and a mask is formed, exposing only the sink region 17. A sink implant using an implant energy of between about 100 and 180 keV is preferred using phosphorous as a dopant. The resulting dopant concentration in the sink region 17 is between about $1 \times 10^{18}$ and $1 \times 10^{20}$. The sink mask is then removed and a separate mask/ion implantation is performed to dope the well and channel regions of the PMOS transistor to a concentration of between about $1\times10^{16}$ and $1\times10^{17}$ using phosphorous as a dopant. In preferred embodiments the implant energy used for the PMOS well region is between about 50 and 180 keV. The resulting net dopant concentration in the channel region of the n-well is between about $1\times10^{16}$ and $1\times10^{20}$. The sink and n-well are then annealed and driven-in by heating with a conventional thermal cycle in nitrogen.

Thereafter, a mask is formed on the surface of the device which exposes only the NMOS and PMOS transistor regions. This mask is used for a threshold voltage implant as shown in FIG. 2b. The implant may be used to adjust the threshold voltage of the NMOS and PMOS transistors by setting the channel doping as necessary, typically to between about $|0.5|$ and $|1.0|$ volts. In preferred embodiments the threshold voltage implant is an implant of boron at a dose of between about $1\times10^{12}$ to $1\times10^{13}$ and an energy of between about 30 and 100 keV. The threshold voltage implant sets the threshold of the NMOS transistors. The boron and the up-diffusing p+ from the buried layer will set the well profile for the NMOS transistor. The threshold voltage implant in conjunction with the n-well implant set the threshold voltage for the PMOS transistor. In preferred embodiments the threshold voltage implant ultimately provides transistors with threshold voltages of 0.7 to 0.9 volts for NMOS and $-0.8$ to $-1.0$ volts for PMOS.

The screen oxide then is stripped and a thin (on the order of 100 to 200Å, preferably 135 to 165Å) gate oxide layer is grown using means well known to those of skill in the art. A thin (on the order of 100 to 1000Å, preferably 400 to 600Å) layer of polysilicon 60 (FIG. 2c) is then deposited on the thin gate oxide layer and a mask 62 is formed on the polysilicon layer to define the NMOS and PMOS gates. A plasma etch removes the undesired polysilicon from all regions of the device except those over the NMOS and PMOS gates 38, 40. The mask is then removed by conventional techniques. Protection of the gate oxide by the thin polysilicon layer 60 provides MOS gates 38, 40 having fewer defects since they are not exposed directly to photoresist.

FIG. 2d illustrates the next sequence of process steps. Another layer of intrinsic polysilicon 64 having a thickness of about 3500Å is deposited across the surface of the device and a cap oxide layer 66 is formed by thermal oxidation of the polysilicon layer 64. The devices are then masked with photoresist to expose at least the base region of the bipolar transistor and the lightly doped regions of the resistors. In some embodiments, only the NMOS and PMOS transistor regions are protected by the mask. A base implant 67 is then performed and the base is annealed. In preferred embodiments the base implant uses an energy of between about 30 and 100 keV. Before annealing, the polysilicon has a net dopant concentration of between about $1\times10^{17}$ and $1\times10^{19}$, and a portion of this dopant is diffused into the base region 18 (FIG. 2e) during the anneal. In preferred embodiments the anneal is performed by heating the structure to 900°-1000° C. for 20 to 60 minutes, and results in a p— base region having a thickness of between about 1000 and 4000 with a dopant concentration of between about $1\times10^{17}$ and $1\times10^{19}$, with a dopant concentration of about $1\times10^{18}$ preferred.

Thereafter, a mask is formed which exposes regions 70a, 70b, 70c, and 70d (FIG. 2e) which will eventually be a portion of the resistor 24, the base contacts 26, 26', and the PMOS source and the well tap contact 32. The regions are preferably doped p+ to a concentration of between about $1\times10^{17}$ and $1\times10^{20}$ with a dopant concentration of about $1\times10^{19}$ preferred using boron. The p+ mask is removed and another mask is formed on the surface of the device to expose regions 68a, 68b, and 68c which will eventually be used as the bipolar emitter contact 27, the bipolar collector contact 20, the NMOS source contact 28, the NMOS gate 30, and the PMOS drain contact 36a. The regions 68 are doped n+ using an implant energy of about 100 keV to a concentration of between about $1\times10^{18}$ and $1\times10^{20}$ with a dopant concentration of between about $1\times10^{19}$ and $1\times10^{20}$ preferably using arsenic. As discussed above, the PMOS gate may be either n+ or p+ and thus may be included in either the n+ or p+ mask.

In FIG. 2f, a layer of nitride 69 having a thickness of between about 1000 and 1500Å is deposited for the purpose of preventing the later implants from going through resistor, emitter, and MOS gates. The polysilicon layer 64 is then annealed at 850° to 950° C. for a time of about 10 to 20 minutes.

Next, a mask is formed on the surface of the nitride to define the base, emitter, and collector contacts of the bipolar transistor and the source contacts, gates, and drain contacts of the NMOS and PMOS transistors. A dry etch with chlorine or bromine n chemistry results in the structure shown in FIG. 2g. The mask is then removed. A blanket lightly doped drain (LDD) implant is performed in, which the source and the drain are lightly implanted with an n-type dopant such as phosphorous or arsenic using an implant energy of between about 20 and 100 keV with implant energies of between about 20 and 50 preferred. This implant results in a net dopant concentration in the source and drain regions 72 of the NMOS transistor of between about $1\times10^{17}$ and $1\times10^{19}$. In a similar fashion, as illustrated in FIG. 2h, a p-type LDD using a dopant such as $BF_2$ or B+ is performed across the surface of the bipolar transistor and the PMOS transistor with only the source and drain of the PMOS transistor and the extrinsic base region of the bipolar transistor exposed by a mask. A more heavily doped p-region 74 is formed in the extrinsic base of the bipolar transistor and a more heavily doped p-region 76 is formed around the gate of the PMOS transistor. The resulting net dopant concentration in the regions 74 and 76 is between about $1\times10^{17}$ and $1\times10^{20}$, with about $1\times10^{19}$ preferred. The implant energy is preferably between about 10 and 50 keV. When 11 B+ is used as the dopant, the lower range of implant energy is used.

A cap oxidation is performed to protect the heavily doped silicon regions during the nitride strip. Nitride is then stripped from the surface of the device and a Low Temperature Oxide (LTO) deposition is performed. A silicide exclusion mask, not shown, is formed on the device on polysilicon regions where silicide formation is not desired (e.g., over the center portion of the resistor). The oxide is then etched back, leaving oxide 45 over the resistor 24 and leaving spacer oxide on exposed sides of the source contacts 28, 36, well tap 32, gates 30, 34, emitter contact 27, base contacts 26, 26', and collector contact 20 as shown in FIG. 2i using means known to those of skill in the art. Another mask 79 is then formed over the device for protection of at least the sidewall oxide on the bipolar emitter contact 27 and the gates 30, 34 of the NMOS and PMOS transistors and the resistor oxide 45. The device is etched with BOE for about 80 seconds and, as shown in FIG. 2j, the oxide is removed from the sidewall of the resistor/base contacts 26, 26', the collector contact 20, and the source and drain contacts 28, 32, 36a of the NMOS and PMOS transistors.

Referring to FIG. 2k, a mask is formed and a heavy p+ (BF$_2$) implant is performed in the regions shown therein, i.e., in the region of the source/drain of the PMOS transistor and the extrinsic base region of the bipolar transistor. The purpose of this implant is to lower the p+ source/drain and the base sheet resistance and contact resistances. The implant uses an energy of between about 20 and 100 keV, with 40 keV preferred. Similarly, as shown in FIG. 2l, an n+ (arsenic) implant is performed in the region of the source/drain of the NMOS transistor for the purpose of lowering n+ source/drain sheet resistance and contact resistance. The arsenic implant uses an energy of between about 50 and 150 keV, with 100 keV preferred. The device is then RTA annealed at a temperature of about 1000° to 1100° C. for about 10 to 20 seconds.

Next, a layer of refractory metal such as titanium, molybdenum, tantalum, tungsten, or the like, is deposited across the surface of the device. Using means well known to those of skill in the art, the layer is heated to form metal silicide in regions where the deposited metal is in contact with polysilicon and silicon. Remaining unreacted metal is then etched away from the device, leaving a structure as shown in FIG. 2m. Preferably, the silicide reaction is conducted in two steps. The initially deposited titanium is reacted with adjacent polysilicon and silicon for a first period of time, as needed to form an initial amount of silicide that will adhere to the adjacent layers. In the first reaction, titanium does not react with SiO$_2$. Unreacted titanium, principally titanium in contact with any oxide, is removed, for example using H$_2$O$_2$ or NH$_3$OH. The device is again heated to cause a second silicide reaction to occur, completing the reaction between titanium and adjacent polysilicon and epitaxial silicon. The reaction is preferably conducted in two steps, as described, because reaction of titanium in a single step or pulse may cause undesirable reaction of titanium with the sidewall oxide layers.

As shown in FIG. 2m, the bipolar polysilicon base contacts 26, 26' are covered with silicide 46 across their horizontal upper surfaces, and along their vertical sidewalls. In addition, the silicide contacts extend from the vertical sidewalls along the horizontal upper surface of the single-crystal base fully up to the sidewall oxide of the emitter 27. The silicide contact 48 of the emitter 27 extends across the horizontal upper surface of the emitter from one sidewall oxide to the opposite sidewall oxide. The silicide 80 on the collector contact 20 extends up both vertical sidewalls of the collector contact and fully across the horizontal upper surface of the contact, terminating on the field oxide regions 22b and 22c. The silicide 54a on the NMOS polysilicon source contact 28 extends from the field oxide region 22c, up the vertical sidewall of the contact, across its upper surface, and down the vertical portion of the contact to the single-crystal source region of the NMOS transistor. Additionally, the silicide extends from the contact across the horizontal upper portion of the source region 20a to the gate sidewall oxide. Like the bipolar emitter contact 27, the polysilicon gate 30 of the NMOS transistor includes silicide 50 across its upper surface which extends from one oxide sidewall to the opposite sidewall oxide.

The polysilicon well tap 32, which has opposite doping from the NMOS source 28, also is covered with silicide 54b which covers both the vertical sidewalls and horizontal upper surface of the contact. Additionally, the silicide 54b extends across the upper surface of the transistors up to the sidewall oxide of the NMOS transistor gate 30. The well contact layer 54b extends close to the gate 30, and yet is spaced therefrom by the sidewall oxide layers 42, thus preventing unwanted formation of a junction between the well tap 32 and the gate 30.

The PMOS gate 34 includes silicide 52 across its horizontal upper surface, while the PMOS source contact 36a includes silicide 54d across its horizontal upper surface, its vertical sidewall, and across the horizontal surface of the drain up to the gate sidewall oxide 42. As noted, the PMOS drain contact and well tap 32 includes silicide across the horizontal upper surface. The well tap is also covered with silicide on the vertical sidewalls. Additionally, the silicide extends across the upper surface of the PMOS transistor drain 20c up to the sidewall oxide 42 of the PMOS transistor gate 34. The well contact silicide layer 54b extends close to the gate contact 34 and yet is spaced therefrom by the sidewall oxide layers 42, thus preventing unwanted formation of a junction between the well tap 32 and the gate 34.

The contact scheme disclosed herein provides reduced source/drain resistance through silicidation of the sidewall polysilicon contact strap, thereby increasing the current drive capability of the CMOS transistors and eliminating the polysilicon-silicon contact resistance. Reduced polysilicon source/drain to the epitaxial silicon source/drain overlap is obtained by removing the sidewall spacer oxide and silicidation of this sidewall, since the current will be carried through this sidewall silicide and not through the epitaxial silicon-polysilicon interface. This provides for a higher packing density through smaller CMOS transistor active areas.

It is believed that sidewall silicidation of the local interconnects improves the resistance of the interconnect by a factor of 2, thereby enhancing the circuit performance. Silicided polysilicon according to the invention herein, as applied to a ground tap, would reduce the ground tap resistance by conducting the current through the silicided sidewall 54b of the polysilicon well tap 32 to the substrate rather than through the doped polysilicon 32 to the substrate. The well tap 32 can operate as a contact for two types of epitaxial silicon (i.e. an NMOS drain contact for the n-type NMOS drain 20b and a PMOS drain contact for the p-type PMOS drain 20c) because the silicide 54b effectively forms a short circuit across what would otherwise be a junction. Provision of the described self-aligned well tap provides for higher packing density because laterally separated well tap regions are not needed. The described device provides for a lower buried layer-to-substrate capacitance because separate well isolation islands are not needed.

FIG. 2n illustrates the next step in the fabrication sequence in which oxide layer 56 is deposited and masked to form contact holes therein. Metal is deposited on the surface of the device, masked, and etched from selected regions, providing the device shown in FIG. 1.

III. Device Performance

Table 1 summarizes the electrical parameters of devices fabricated according to one embodiment of the invention above. Table 1 illustrates the key CMOS and bipolar transistor targets.

TABLE 1

BiCMOS Transistor Parameters

| CMOS: | |
|---|---|
| Gate oxide thickness [Å] | 150 ± 15 |
| $L_{eff}$(n-channel) [μm] | 0.7 ± 0.15 |
| $L_{ff}$(p-channel) [μm] | 0.7 ± 0.15 |
| Minimum p- and n- gate length | 0.8 |
| n-threshold voltage [V] | 0.75 ± 0.1 |
| p-threshold voltage [V] | −0.85 ± 0.1 |
| n-channel $I_{dsat}$ [mA/μm] | >0.38 |
| p-channel $I_{dsat}$ [mA/μm] | >0.17 |
| $I_{sub}$ (i.e., substrate current) [μA/μm] | 1 ± 20% |
| NPN: | |
| Minimum emitter width [μm] | 0.8 |
| Device area [μm$^2$] | 1.6 × 6.1 |
| Current gain | 90 |
| E-B breakdown [V] | 6 |
| C-B breakdown [V] | 16 |
| C-E breakdown [V] | 8 |

Figure 4B:
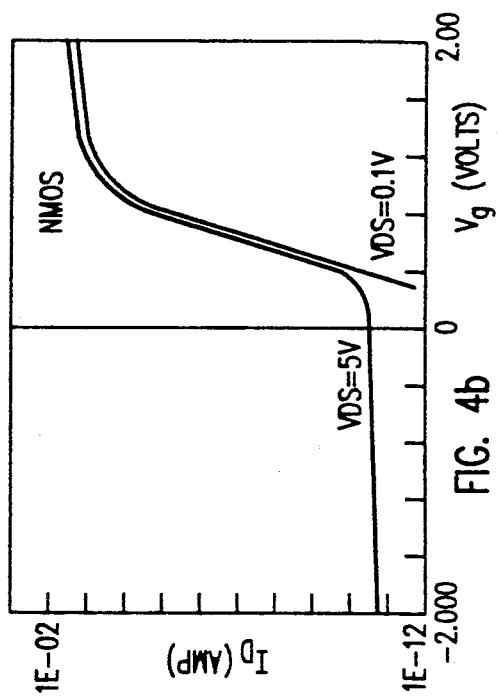
FIG. 4a and 4b illustrate $I_d$ versus $V_{gs}$ for PMOS and NMOS transistors respectively.
Figure 3:
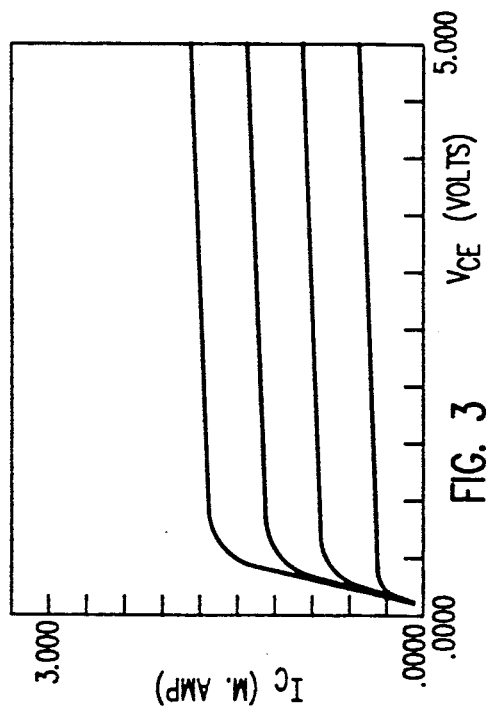
FIG. 3 illustrates $I_c$ versus $V_{ce}$ for a bipolar transistor according to one embodiment of the invention.
Figure 4A:
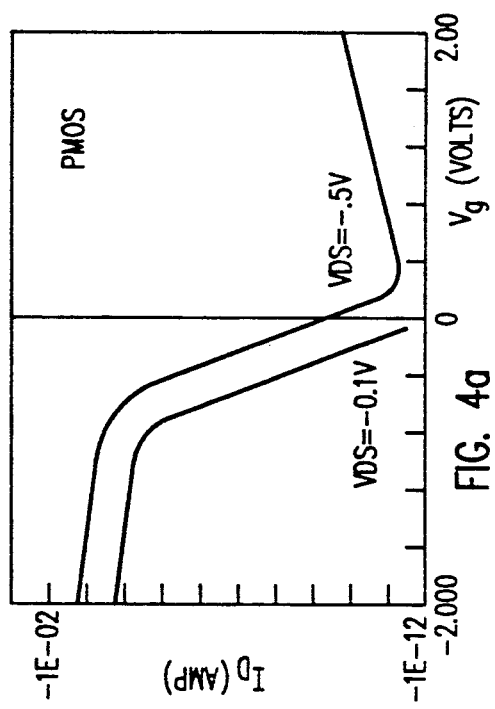

FIG. 3 illustrates a typical $I_c$ versus $V_{ce}$ curve for a bipolar transistor fabricated according to one embodiment of the invention. FIG. 3 shows that the 5 devices have a high Early voltage (of the order of 10 V to 30 V). It is believed that high Early voltages are obtained because the total base charge is high even though the base width is small. FIGS. 4a and 4b are subthreshold slopes for 40/0.8 (i.e., width=40 μm, length=0.8 μm) PMOS and NMOS transistors, respectively, for drain voltages of 0.1 and 5 volts. The transistors have off to on current ratios of better than 6 decades, with leakage currents in the nA range for $V_{ds}=\pm 5$ v.

Figure 5:
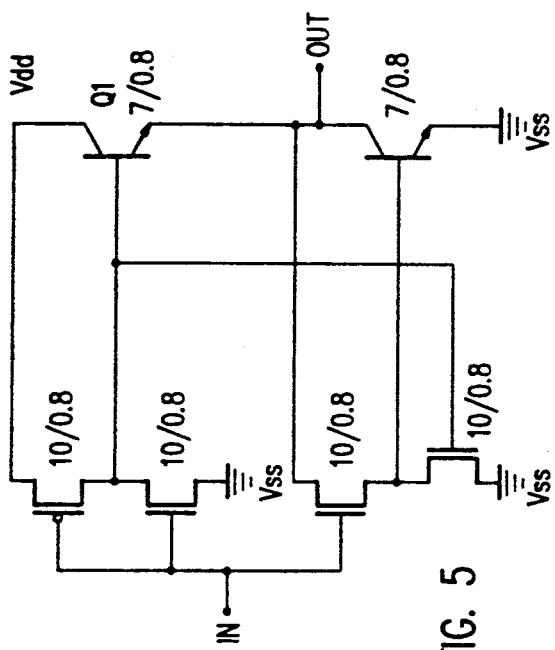
FIG. 5 illustrates a BiCMOS ring cell used in testing one embodiment of the invention.

Table 2 provides simulated gate delays for loaded and unloaded CMOS, BiCMOS, and ECL devices fabricated according to one embodiment of the invention. FIG. 5 illustrates the BiCMOS ring cell used to develop the data shown in Table 2. Table 2 illustrates that devices fabricated according to the inventions herein provide high performance CMOS rings as compared to typical prior CMOS rings.

TABLE 2

Ring Oscillator Delays (picoseconds)

| | No Load | 0.5 pF Load |
|---|---|---|
| CMOS | 82 | 415 |
| BiCMOS | 185 | 290 |
| ECL | 55 | 120 |

It is to be understood that the above description is intended to be illustrative and not restrictive. Many variations of the invention will become apparent to those of skill in the art upon review of this disclosure. Merely by way of example particular regions of the devices shown herein have been illustrated as being p-type or n-type, but it will be apparent to those of skill in the art that the role of n- and p-type dopants may readily be reversed. Further, while the invention has been illustrated with regard to specific dopant concentrations in some instances, it should also be clear that a wide range of dopant concentrations may be used for many features of the devices herein without departing from the scope of the inventions herein. Still further, while the inventions herein have been illustrated primarily in relation to a BiCMOS device, many facets of the invention could be applied in the fabrication of bipolar transistors, MOSFETs, or other devices in isolation. Still further, the invention has been illustrated primarily with regard to lateral devices, but the inventions herein could be applied equally well to vertical devices. The scope of the invention should, therefore, be determined not with reference to the above description, but instead should be determined with reference to the appended claims along with their full scope of equivalents.

What is claimed is:

1. In a substrate having a channel region of a first conductivity type and source and drain regions with upper surfaces, formed in a doped well region of said first conductivity type, with said channel region separated from a doped polysilicon gate by an oxide layer, said polysilicon gate having at least one sidewall surface and an upper surface, said source, drain, and gate defining a first field effect device, at least one of said source and drain regions overlain by a first doped polysilicon region of said first conductivity type having upper and sidewall surface, a method for forming a combination well tap and source/drain contact for said field effect device, comprising:

forming a connective region of said first conductivity type in said substrate adjacent said one of said source and drain regions said connective region also being adjacent a portion of said first doped polysilicon region, said connective region providing a portion of a substantially conductive path between said well region and said first doped polysilicon region to configure said first polysilicon region as a well tap; and forming metal silicide on at least said upper surface and at least a sidewall surface of said first polysilicon region and at least a portion of said upper surface of said one of said source and drain regions, said silicide layer forming a substantially conductive path between said one of said source and drain regions and said first polysilicon region to configure said first polysilicon region as a contact for said one of said source and drain regions.

2. A method, as claimed in claim 1, wherein said one of said source and drain regions is of a second conductivity type different from said first conductivity type.

3. A method, as claimed in claim 1, wherein said first polysilicon region contacts one of a source and drain of a second filed effect device, said one of said source and drain having said first conductivity type and wherein said step of forming metal silicide further comprises:

forming metal silicide on a portion of the upper surface of said one of said source and drain regions of said second field effect device.

4. A method, as claimed in claim 1, further comprising selectively positioning oxide on a sidewall of said gate.

5. A method, as claimed in claim 4, wherein said step of positioning oxide includes:

coating at least a portion of the substrate with said oxide;

etching a portion of said oxide coating to leave at least a layer of spacer oxide on a first sidewall of said gate;

masking at least said first gate sidewall oxide layer; and etching to remove unmasked oxide.

6. A method, as claimed in claim 4, wherein said metal silicide layer extends substantially from a sidewall of said first doped polysilicon region to said oxide on one sidewall of said gate.

7. A method, as claimed in claim 1, wherein said step of forming metal silicide comprises:

coating at least said first polysilicon region upper surface and sidewall and a portion of the upper surface of said one of said source and drain regions with a refractory metal;

reacting at least a portion of said refractory metal which is adjacent to said first polysilicon region and said one of said source and drain regions with portions of said polysilicon and said substrate; and removing unreacted portions of said refractory metal.

8. A method, as claimed in claim 7, wherein said step of removing includes contacting said refractory metal with materials selected from the group consisting of $H_2O_2$ and $NH_3OH$.

9. A method for forming a combined well tap and source/drain contact for a field effect device, comprising:

providing a substrate having at least a first isolation well having a first conductivity type;

forming doped source and drain regions in said substrate and a channel region, said source and drain regions having of a second conductivity type different from said first conductivity type;

positioning a gate oxide layer adjacent a portion of said substrate;

forming a layer of polysilicon on a portion of said substrate;

doping a first region of said polysilicon to form a gate adjacent said gate oxide layer, said source, gate and drain defining a first field effect device;

doping a second region of said polysilicon layer to provide said second region with said first conductivity type;

selectively etching portions of said polysilicon layer to define a space between said first and second polysilicon regions, exposing a first region of said substrate, said first region of said substrate being an upper surface of one of said source and drain regions;

diffusing doping material from said second polysilicon region into said substrate to form a diffused region, said diffused region providing a portion of a substantially conductive pathway between said second polysilicon region and said isolation well to configure said second polysilicon region as a well tap; and coating portions of said upper and sidewall surfaces of said second polysilicon region and said first substrate region with a metal silicide, said metal silicide forming a substantially conductive path between said second polysilicon region and said one of said source and drain regions to configure said second polysilicon region as a contact for said one of said source and drain regions.

10. A method, as claimed in claim 9, wherein said second region contacts one of a source and drain of a second field effect device, said one of said source and drain of said second field effect device having said first conductivity type, and wherein said step of coating further comprises:

coating a portion of the upper surface of said one of said source and drain regions of said second field effect device with metal silicide.

* * * * *